United States Patent [19]
Face et al.

[11] Patent Number: 5,567,673
[45] Date of Patent: Oct. 22, 1996

[54] PROCESS OF FORMING MULTILAYERED TL-CONTAINING SUPERCONDUCTING COMPOSITES

[75] Inventors: Dean W. Face, Wilmington, Del.; Kirsten E. Myers, Philadelphia, Pa.

[73] Assignee: E. I. Du Pont de Nemours and Company, Wilmington, Del.

[21] Appl. No.: 412,424

[22] Filed: Mar. 29, 1995

Related U.S. Application Data

[62] Division of Ser. No. 323,560, Oct. 17, 1994, abandoned.

[51] Int. Cl.$^6$ .................................................. H01L 39/24
[52] U.S. Cl. .................. 505/329; 505/330; 505/473; 505/475; 505/190; 505/238; 505/501; 505/702; 505/742; 427/62
[58] Field of Search ................................. 505/329, 330, 505/190, 191, 475, 501, 702, 742, 473; 427/62, 63

[56] References Cited

U.S. PATENT DOCUMENTS

| | | | |
|---|---|---|---|
| 4,454,522 | 6/1984 | deLozanne | 357/5 |
| 5,134,117 | 7/1992 | DiIorio et al. | 505/1 |
| 5,252,551 | 10/1993 | Wu et al. | 505/1 |
| 5,374,610 | 12/1994 | Fukushima et al. | 505/190 |

FOREIGN PATENT DOCUMENTS

| | | | |
|---|---|---|---|
| 0443827 | 8/1991 | European Pat. Off. | H01L 39/12 |
| WO94/07270 | 3/1994 | WIPO | H01L 39/22 |

OTHER PUBLICATIONS

Face et al, IEEE Transactions on applied superconductivity, vol. 3, No. 1, Mar. 1993, pp. 1516–1519.
Myers, K. E. et al, *Appl. Phys. Lett.*, 65(4), 490–492 (Jul. 25, 1994).
Maissel, L. I. et al, (Ed.), *Handbook of Thin Film Technology*, pp. 1–16, 17; 1–36, 37; 1–66, 67; McGraw–Hill, New York, NY (1970).
Rogers, C. T. et al, *Appl. Phys. Lett.*, 55(19), 2032–2034, (Nov. 6, 1989).
Char, K. et al, *Apply. Phys. Lett.*, 62(2), 196–198 (Jan. 11, 1993).
Koch, R. H. et al, *Appl. Phys. Lett.* 54(10), 951–953 (Mar. 6, 1989).
Roas, B. et al, IEEE Transactions on Applied Superconductivity, 3(1), 2442–2444 (Mar. 1993).
Face, D. W. et al, *Advances in Superconductivity VI*, Fujita et al (Eds.), Springer–Verlag, Tokyo, 863–868 (1994).
Nakajima, S. et al, *Physica C 170*, 443–447 (1990).
Ohshima, E. et al, *Physica C 214*, 182–186 (1993).

*Primary Examiner*—Roy V. King

[57] ABSTRACT

This invention relates to a process of forming multilayered thallium-containing superconducting composites, wherein a first thallium-containing superconducting layer, an intermediate thallium-containing oxide layer and a second thallium-containing superconducting layer are successively deposited on a substrate by a vapor phase process by controlling the heating temperature, pressure of oxidizing gas and thallium vapor pressure during post-deposition annealing of the superconducting films.

5 Claims, 3 Drawing Sheets

PROCESS OF FORMING MULTILAYERED TL-CONTAINING SUPERCONDUCTING COMPOSITES

This is a division of application Ser. No. 08/323,560, filed Oct. 17, 1994 now abandoned.

FIELD OF THE INVENTION

This invention relates to multilayered superconductive composites, particularly to composites based on thallium-containing superconducting oxides, and their process of manufacture.

BACKGROUND OF THE INVENTION

Multilayered superconductive composites are known in the art to be useful as conductive devices in a wide variety of forms and applications. Such multilayered composites are typically comprised of combinations of vapor phase deposited contiguous thin films of superconductive materials with either conductive materials, insulators or both conductive materials and insulators.

Common multilayered superconductive composites are utilized as Josephson junctions, such as the trilayer devices described in C. T. Rogers, A. Inam, M. S. Hedge, B. Dutta, X. D. Wu, and T. Venkatesan, Appl. Phys. Lett., 55, Nov. 6, 1989, pages 2032–2034 and in K. Char, M. S. Colclough, T. H. Geballe, and K. E. Myers, Appl. Phys. Lett., 62, Jan. 11, 1993, pages 196–198. In typical Josephson devices the multilayers consist essentially of two superconductive layers bridged by a normal conductive layer (called an SNS device), with the optional presence of an insulator to confine the extent of the device. The junction is formed at the area where the superconductive layers overlap and are only separated by the normal conductive material.

Superconductive composites are also commonly utilized as SIS devices which consist essentially of two superconducting layers separated by a very thin insulator layer, thin enough to allow superconducting electrons to tunnel from one superconducting layer to the other through said insulator (typically 1 to 10 nm), with the optional presence of a thick insulator to confine the extent of the device. The junction is formed at the area where the superconductive layers overlap and are only separated by the very thin insulator layer.

There are other structures which may be utilized in the fabrication of Josephson devices, as described in U.S. Pat. No. 4,454,522 and U.S. Pat. No. 5,134,117. In these devices only one superconductive layer is used. The device is formed at a step-edge or at a naturally-occuring grain boundary. Grain boundary devices have been made utilizing thallium-containing superconductors as in R. H. Koch, W. J. Gallagher, B. Bumble, and W. Y. Lee, Appl. Phys. Lett., 54, Mar. 6, 1989, pages 951–953. However, these devices have several disadvantages as compared with multilayer devices: 1) lack of control over the critical device parameter, $I_c R_N$ which is the product of the critical current of the junction $I_c$ and the normal state resistance of the junction $R_N$, and, for grain boundary junctions, 2) lack of reproducability and manufacturability due to the fact that these devices rely on the formation of defects.

Superconductive composites are also commonly used in making devices such as multiturn flux transformers, i.e., antennas (B. Roas, G. Friedl, F. Bömmel, G. Daalmans, and L. Schultz, IEEE Trans. on Appl. Super., 3, No. 1, 1992, pages 2442–2444) or, more generally in circuits which require two superconductive lines to cross without making electrical contact. A flux transformer in conjunction with a Superconducting Quantum Interference Devices (SQUID) comprise a superconducting magnetometer, a device useful in the detection of extremely small magnetic fields.

While prior junction devices are satisfactory for many applications, it has not been possible to utilize certain of the particularly desirable thallium-containing superconducting materials, which can permit operation at temperatures higher than 90° K., in the preferred multilayer devices due to difficulty in fabrication of superconducting layers in the composite which have the proper stoichiometry to render said layers superconductive. Thallium oxide is a relatively volatile oxide component and tends to evaporate from the deposited film during processing and to react, i.e., form undesired compounds, with certain materials such as $Al_2O_3$ and $SrTiO_3$, which are commonly used as substrates or insulators in device configurations.

A successful method for depositing thallium-containing superconductive films per se is described in Myers et al., Appl. Phys. Lett., 65(4), 25 Jul. 1994, pages 490–492. The process is also described in detail in commonly assigned copending application Ser. No. 08/151,236, filed Nov. 12, 1993, now U.S. Pat. No. 5,386,606. This process provided a method for depositing single thallium-containing superconducting films on a substrate. A successful method for depositing a single insulating layer on top of a thallium-containing superconducting film is described in Face et al., Advances in Superconductivity VI, T. Fujita and Y. Shinohara, Eds., (New York: Springer-Verlag, Oct. 26–29, 1993) pages 863–868, but problems arose when attempts were made to create a composite structure involving deposition of a second superconductive layer. The insulator described by Face et al. cannot be deposited in the presence of thallium vapor and therefore must be deposited at a relatively low temperature, since otherwise there would be thallium evaporation from the first deposited thallium-containing layer. The structure of the insulator is compromised by the low deposition temperature. Multiple attempts to grow a second thallium-containing superconductor on top of the insulator failed.

SUMMARY OF THE INVENTION

This invention provides for an improved multilayer composite article comprising a substrate, a first superconductive layer, at least one intermediate layer comprising an insulating layer or a normal conductive layer and a second superconductive layer, wherein all of said layers at least partially overlap, the improvements comprising said first superconductive layer, said normal conductive layer, and said second superconductive layer each independently consists essentially of at least one thallium-containing oxide and, when said insulating layer is in contact with both of said first and second superconductive layers, said insulating layer consists essentially of a thallium-containing oxide.

The present invention also provides an improved vapor phase process for preparing the multilayered composite articles of the invention by vapor phase depositing successive layers by providing a first source of relatively volatile thallium-containing oxides, providing a second source of involatile oxides, depositing said involatile oxides from said second source onto a substrate while concurrently depositing a sufficient amount of thallium-containing oxides from said first source onto said substrate to provide a crystalline thin film of predetermined stoichiometry, wherein, when the deposited film is a superconducting film, the improvement comprises heating the superconducting film to a temperature greater than 700° C. but less than the decomposition temperature of the film, preferably 700° C. to 850° C., more preferably 775° C. to 800° C., in the presence of $O_2$ or $N_2O$ at a pressure of from about $1.33 \times 10^{+4}$ Pa to about $10.1 \times 10^{+5}$ Pa. When the uppermost layer is a superconducting film, a thallium vapor pressure sufficient to avoid evaporation of thallium from said film must be present when the sample is reheated and exposed to the relatively low oxygen partial pressure necessary to deposit subsequent layers.

DETAILED DESCRIPTION OF THE INVENTION

Figure 1:
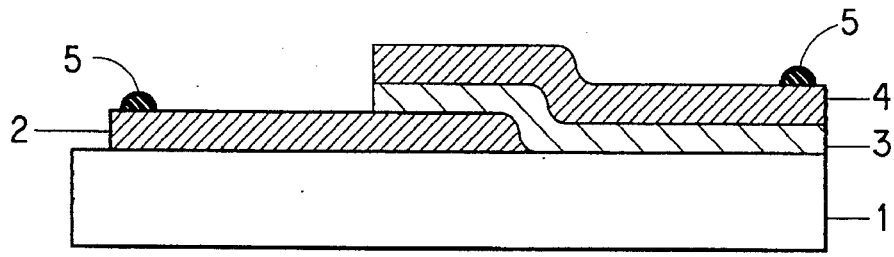
FIG. 1 is a cross sectional view of a multilayer composite article in the form of a junction device in a trilayer configuration.

FIG. 1 is a cross sectional view of a multilayer composite article in the form of a junction device in a trilayer configuration, wherein substrate 1 supports the first superconducting layer 2 and a portion of the normal conducting layer 3. The second superconductive layer 4 is deposited on normal conductive layer 3. Electrodes 5 are deposited on the first and second superconductive layers to allow for connection to a source of electric current. The effective junction area on this device exists at the area where the first superconductive layer, normal conductive layer and second superconductive layer overlap.

Figure 2:
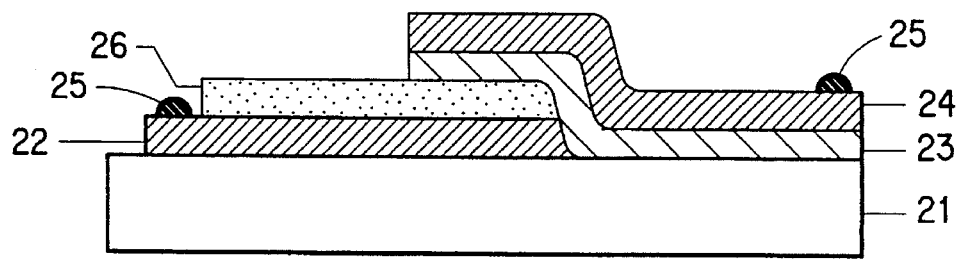
FIG. 2 is a cross sectional view of a multilayer composite article in the form of a junction device in an edge configuration.

FIG. 2 is a cross sectional view of a multilayer composite article in the form of a junction device in an edge configuration, wherein substrate 21 supports the first superconducting layer 22 and a portion of the normal conducting layer 23. The second superconductive layer 24 is deposited on normal conductive layer 3. Electrodes 25 are deposited on the first and second superconductive layers to allow for connection to a source of electric current. This configuration also has an insulating material 26, which need not consist essentially of a thallium-containing oxide, between the first superconductive layer 22 and the normal conductive layer 23 to confine the junction area to the angular edge where the first superconductive layer 22, normal conductive layer 23 and second superconductive layer 24 overlap.

Figure 3:
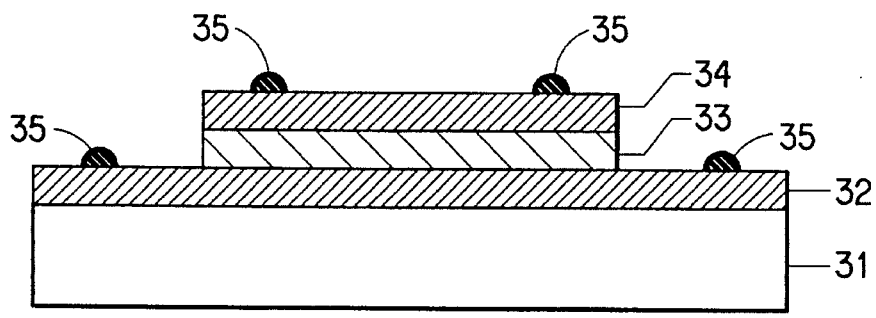
FIG. 3 is a cross sectional view of a multilayer composite article in the form of a junction device in an alternate trilayer configuration.

FIG. 3 is a cross sectional view of a multilayer composite article in the form of a junction device in an alternate trilayer configuration, wherein substrate 31 supports the first superconducting layer 32 which in turn supports intermediate layer 33, which can be a normal conductive material or an insulating material. The second superconductive layer 34 is deposited on intermediate layer 33. Electrodes 35 are deposited on the first and second superconductive layers to allow for connection to a source of electric current. The effective junction area on this device exists at the area where the first superconductive layer, intermediate layer and second superconductive layer overlap.

Figure 4:
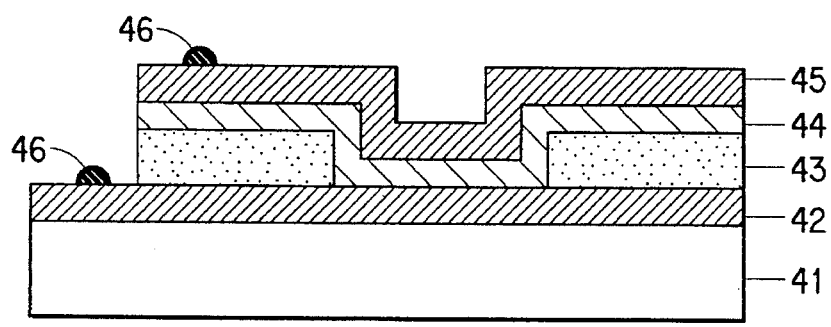
FIG. 4 is a cross sectional view of a multilayer composite article in the form of a junction device in another alternate trilayer configuration.

FIG. 4 is a cross sectional view of a multilayer composite article in the form of a junction device in another alternate trilayer configuration, wherein substrate 41 supports the first superconducting layer 42 which in turn supports, but is not completely covered by the insulator layer 43. The normal conducting layer 44 is supported by the insulator and by the first superconductor layer. The second superconductive layer 45 is deposited on normal conductive layer 44. Electrodes 46 are deposited on the first and second superconductive layers to allow for connection to a source of electric current. The effective junction area on this device exists at the area where the first superconductive layer, normal conductive layer and second superconductive layer overlap and are only separated by the normal conductive layer.

Figure 5A:
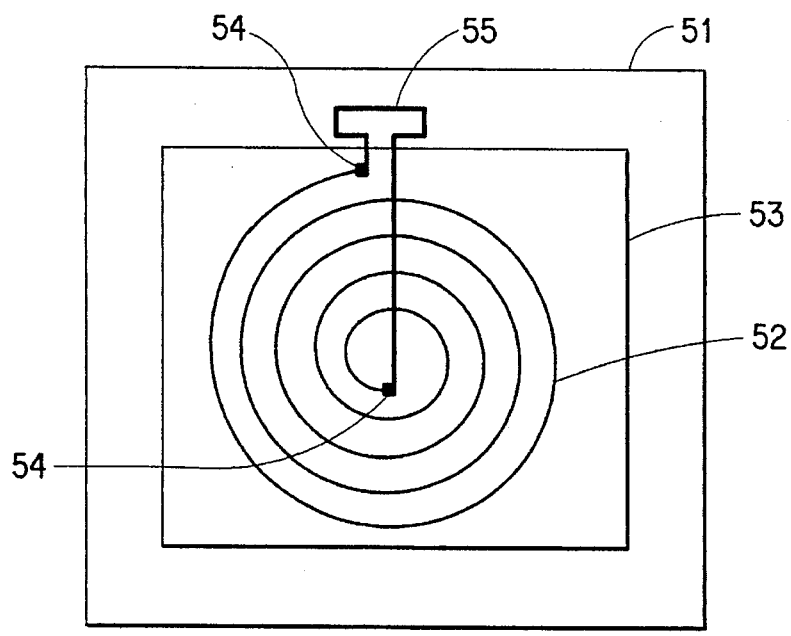
FIGS. 5a and 5b are a top and a cross sectional view of a multiturn pick-up coil which contains a multilayer composite article of the invention.
Figure 5B:
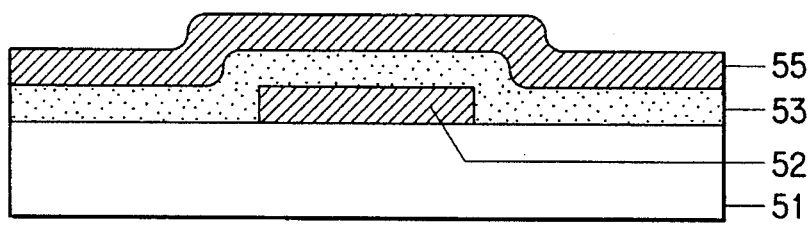

FIGS. 5a and 5b are a top and a cross sectional view respectively of a multiturn pick-up coil which contains a multilayer composite article of the invention. In this device, a substrate 51 supports the first superconducting layer 52 which is patterned, in this case into a spiral. An insulator 53 is deposited over the first superconducting layer, except in those areas where electrical contact is desired for the functioning of the device, in this case, 54. The second superconductive layer 55 is deposited on the insulator 53, and on the first superconductive layer 52 in the areas 54. The insulator 53 does not allow electrical current to pass between the two superconductive layers except at the areas 54.

It is essential that all the layers of the multilayered composite of this invention be thallium-containing, with the exception of the insulator layer useful in some geometries, e.g., see FIG. 2, element 26, where it is not essential that a superconducting film be deposited directly above said insulator.

Thallium-containing superconductive oxides particularly useful as the superconductive layers in the multilayered composite of this invention include materials of the formulas:

I. $Tl(Ba_{1-x}M^1_x)_2(Ca_{1-y}M^2_y)_{n-1}Cu_nO_{2n+3-z}$, wherein $M^1$=Sr, Ca, Y, La, Pr, Nd, Sm, Eu, Gd, Ce, Tl, Pb, Dy, Ho, Er, Tm, or Yb; $0 \leq x \leq 0.2$; $M^2$=Y, La, Pr, Nd, Sm, Eu, Gd, Ce, Tl, Pb, Dy, Ho, Er, Tm, or Yb; $0 \leq y \leq 0.4$; n=2, 3, 4; $0 \leq z \leq 0.5$;

II. $Tl_2(Ba_{1-x}M^1_x)_2(Ca_{1-y}M^2_y)_{n-1}Cu_nO_{2n+4-z}$, wherein $M^1$=Sr, Ca, Y, La, Pr, Nd, Sm, Eu, Gd, Ce, Tl, Pb, Dy, Ho, Er, Tm, or Yb; $0 \leq x \leq 0.2$; $M^2$=Y, La, Pr, Nd, Sm, Eu, Gd, Ce, Tl, Pb, Dy, Ho, Er, Tm, or Yb; $0 \leq y \leq 0.4$; n=1, 2, 3, 4; $0 \leq z \leq 0.5$; and III. $(Tl_{1-w}Pb_w)(Sr_{1-x}M^1_x)_2(Ca_{1-y}M^2_y)_{n-1}Cu_nO_{2n+3-z}$, wherein $0.2 \leq w \leq 0.8$; $M^1$=Ba, Ca, Y, La, Pr, Nd, Sm, Eu, Gd, Ce, Tl, Pb, Dy, Ho, Er, Tm, or Yb; $0 \leq x \leq 0.3$; $M^2$=Y, La, Pr, Nd, Sm, Eu, Gd, Ce, Tl, Pb, Dy, Ho, Er, Tm, or Yb; $0 \leq y \leq 0.6$; n=2, 3; $0 \leq z \leq 0.5$;

Thallium-containing oxides particularly useful as the normal conductive or insulating layers in the multilayered composite of this invention include materials of the formulas:

IV. $Tl(Ba_{1-x}M^1_x)_2CuO_{5-z}$ wherein $M^1$=Sr, Ca, Y, La, Pr, Nd, Sm, Eu, Gd, Ce, Tl, Pb, Dy, Ho, Er, Tm, or Yb; $0 \leq x \leq 0.2$; $0 \leq z \leq 0.5$;

V. $(Tl_{1-w}Pb_w)(Sr_{1-x}M^1_x)_2CuO_{5-z}$ wherein $0.2 \leq w \leq 0.8$; $M^1$=Ba, Ca, Y, La, Pr, Nd, Sm, Eu, Gd, Ce, Tl, Pb, Dy, Ho, Er, Tm, or Yb; $0 \leq x \leq 0.2$; $0 \leq z \leq 0.5$; and VI. $(Tl_{1-w}Pb_w)(Sr_{1-x}M^1_x)_2(Ca_{1-y}M^2_y)Cu_2O_{7-z}$ wherein $0.2 \leq w \leq 0.8$; $M^1$=Ba, Ca, Y, La, Pr, Nd, Sm, Eu, Gd, Ce, Tl, Pb, Dy, Ho, Er, Tm, or Yb; $0 \leq x \leq 0.2$; $M^2$=Y, La, Pr, Nd, Sm, Eu, Gd, Ce, Tl, Pb, Dy, Ho, Er, Tm, or Yb; $0.6 \leq y \leq 1$; $0 \leq z \leq 0.5$;

Examples of other useful conductive materials include $Tl_{0.5}Pb_{0.5}Sr_2CuO_{5-z}$ wherein $0 \leq z \leq 0.2$, and $(Tl_{1-w}Pb_w)Sr_2CuO_{5-z}$ wherein $0 \leq w \leq 0.5$; $0 \leq z \leq 0.2$ Examples of other useful insulating materials include $Tl_{0.5}Pb_{0.5}Sr_2CuO_{5-z}$ wherein $0.25 \leq z \leq 0.5$ and $Tl_{0.5}Pb_{0.5}Sr_2(Ca_{1-y}Y_y)Cu_2O_7$ wherein $0.6 \leq y \leq 1$.

Examples of insulators that could be useful in the layer 26 of FIG. 2, where it is not essential that a thallium-containing superconductor or conductive material be formed directly on top of this layer include $LaAlO_3$, $NdGaO_3$, and $CeO_2$.

Substrates suitable for use in the multilayer composite articles of the present invention include inorganic materials capable of withstanding the deposition temperatures and processing which are epitaxially matched to the adjacent first superconducting layer. Preferred substrates are single crystals. Examples of substrates include $LaAlO_3$, $NdGaO_3$, sapphire with a $CeO_2$ buffer layer, MgO and yttrium-stabilized zirconia.

Depending on the exact stoichiometry of formulas IV, V and VI, the material can be a normal conductor, i.e., have a finite resistivity less than 100 Ωcm at 300° K., or an insulator, i.e., have a resistivity greater than 100 Ωcm at 300° K. These materials are well known in the art. See for example: S. Nakajima, et al., Physica C, 170, 1990, pages 443–447, and E. Ohshima, et al., Physica C, 214, 1993, pages 182–186.

This invention further comprises an improved vapor phase deposition process for the preparation of the multi-layered composites of this invention. This process comprises vapor phase depositing successive layers by providing a first source of relatively volatile thallium-containing oxides, providing a second source of said involatile oxides, depositing said involatile oxides from said second source onto a substrate while concurrently depositing a sufficient amount of thallium-containing oxides from said first source onto said substrate to provide a crystalline thin film of predetermined stoichiometry. When the deposited film is a superconducting film, the superconducting film must be heated to a temperature greater than 700° C. but less than the decomposition temperature of the film, preferably 700° C. to 850° C., more preferably 775° C. to 800° C., in the presence of $O_2$ or $N_2O$ at a pressure of from about $1.33 \times 10^{+4}$ Pa to about $10.1 \times 10^{+5}$ Pa. When the uppermost layer is a superconducting film, a thallium vapor pressure sufficient to avoid evaporation of thallium from said film must be present when the sample is reheated and exposed to the relatively low oxygen partial pressure necessary to deposit subsequent layers.

In accordance with the process disclosure in commonly assigned copending application Ser. No. 08/151,236, now U.S. Pat. No. 5,089,606 which is herein incorporated by reference, the thin film to be made is characterized by the general formula $$A_yB_z$$

where "y" is the relative number of moles of oxide A and "z" is the relative number of moles of oxide B, wherein oxide B can be a single or multicomponent oxide, required to form the desired stoichiometric compound relative to A and B per se. In some cases, additional oxygen may be required to satisfy the stoichiometry. When "A" and "B" are involatile oxides, stoichiometric thin film growth requires that $$[d(A)/dt]=[d(B)/dt] \times (y/z)$$

where $[d(A)/dt]$ and $[d(B)/dt]$ are the relative deposition rates of A and B in units of moles/cm²/second. The deposition rate, as used herein, means the rate at which the oxide is deposited on the substrate without considering re-evaporation from the substrate, see for example pgs. 8–14 to 8–26 in "Handbook of Thin Film Technology", (L. I. Maissel and R. Glang, eds.) McGraw Hill, New York, 1970.

When oxide A is relatively volatile compared to oxide B, it evaporates from the surface of the growing film and causes the actual stoichiometry of the film $(A_y.B_z)$ to deviate significantly from the ideal $A_yB_z$ stoichiometry. For example, in the case of a $TlBa_2CaCu_2O_7$ film, A is $[Tl_2O]$, B is $[Ba_2CaCu_2O_5]$, $y=\frac{1}{2}$ and $z=1$. To compensate for this evaporation effect, the deposition rate of the relatively volatile oxide A must be increased to a rate greater than $[d(B)/dt] \times (y/z)$.

In the improved process of this invention oxide A commonly contains thallium and is relatively volatile compared to oxide B. The deposition rate of oxide A is at least 1.1 times as great, preferably twice as great, and more preferably more than a factor of two greater than $[d(B)/dt] \times (y/z)$, i.e., the deposition rate of oxide B times the stoichiometric ratio of oxide A to oxide B to obtain the desired stoichiometric film of composition $A_yB_z$ under the desired deposition conditions (i.e., for a given substrate temperature, background gas pressure, and total deposition rate).

The improved process of this invention requires that when $A_yB_z$ is a superconductive thallium containing film, the superconducting film must be heated to a temperature greater than 700° C. but less than the decomposition temperature of the film, preferably 700° C. to 850° C., more preferably 775° C. to 800° C., in the presence of $O_2$ or $N_2O$ at a pressure of from about $1.33 \times 10^{+4}$ Pa to about $10.1 \times 10^{+5}$ Pa. Preferably the pressure of $O_2$ or $N_2O$ is a minimum of $2.67 \times 10^4$ Pa, most preferably a minimum of $6.67 \times 10^4$ Pa. Also, when further layers are to be applied to the superconductive layer, this heating must be done prior to the deposition of further layers.

Separate sources of the volatile oxides and the relatively involatile oxides of the film material are employed during vapor deposition of the material onto a substrate. The sources of volatile and/or involatile oxides need not contain oxygen per se, so long as the species produced therefrom can be converted to an oxide, such as by reacting with oxygen in the deposition atmosphere, or can be converted to an oxide at the surface of the growing film, such as by reacting with oxygen at the surface of the film. Control of the amount of volatile oxide in the film is achieved by varying the substrate temperature, the composition of the atmosphere employed during vapor deposition, and rate of deposition of the volatile oxides onto the substrate.

Control of substrate temperature, choice of atmosphere, as well as the rate of deposition of the volatile oxides depends on the composition desired in the film. Generally, the volatile and involatile oxide components of the film are placed into an atmosphere of a mixture of an inert gas and an additional gaseous component for deposition onto the substrate. The atmosphere selected depends on the composition sought in the resultant film. Typically, where the film to be formed is an oxide, the additional gaseous component is an oxygen containing gas, preferably oxygen or nitrous oxide. Although the percentages of inert gas and the additional gaseous component may vary, a sufficient amount of inert gas should be present to enable deposition of the oxides on the substrate. The partial pressure of the additional gaseous component is sufficient to reduce evaporation of the volatile oxide from the film. Accordingly, where oxide films of Tl—B—Ca—Cu or Tl—Pb—Sr—Ca—Y—Cu are to be formed, such as oxide films of $TlBa_2CaCu_2O_7$, $TlBa_2Ca_2Cu_3O_9$, $Tl_2Ba_2CaCu_2O_8$, $Tl_2Ba_2Ca_2Cu_3O_{10}$, $TlBa_2(Ca_{1-x}Y_x)Cu_2O_7$ wherein x is 0 to 0.6, or $Tl_{0.5}Pb_{0.5}Sr_2Ca_{n-1}Cu_nO_{2n+3}$, where n=1, 2 or 3, the additional gaseous component in the atmosphere is oxygen or nitrous oxide. The partial pressure of oxygen or nitrous oxide in that atmosphere may vary from about 3 to about 133 Pa (0.5 mtorr to 1 torr), preferably from about 13 Pa to about 27 Pa (100 mtorr to 200 mtorr) in order to reduce evaporation of $Tl_2O$ from the film being deposited. However, this invention requires that for superconductive layers, an additional heating be conducted at a pressure of $O_2$ or $N_2O$ from about $1.33 \times 10^{+4}$ Pa to about $10.1 \times 10^{+5}$ Pa.

The substrate temperature employed during deposition of the film also depends on the composition of the film to be deposited. Generally, the temperature is sufficient to cause growth of the desired composition but less than that which might cause the film to be deficient in the volatile oxide species. Accordingly, where the film to be deposited is a Tl—Ba—Ca—Cu oxide such as $TlBa_2Ca_2Cu_2O_7$, $TlBa_2Ca_2Cu_3O_9$, $Tl_2Ba_2CaCu_2O_8$, $Tl_2Ba_2Ca_2Cu_3O_{10}$, $TlBa_2(Ca_{1-x}Y_x)Cu_2O_7$ where x is 0 to 0.6, or a Tl—Pb—Sr—Ca—Y—Cu oxide such as $Tl_{0.5}Pb_{0.5}Sr_2Ca_{n-1}Cu_nO_{2n+3}$, where n=1, 2 or 3, substrate temperatures of from about 400° C. to about 700° C., preferably about 550° C. to about 580° C. may be employed.

The involatile oxides to be deposited can be provided in several well known ways. For example, when the sources of involatile oxides are inorganic oxides, radio frequency sputtering or laser ablation of the inorganic oxide can be used to provide the involatile oxide. Preferably, radio frequency sputtering is employed. If the sources of nonvolatile oxides are organometallic compounds, the compounds are volatilized and the organic component thereof is burned off as the compound is deposited onto the substrate.

Deposition of oxides of TlBaCaCu to provide thin films of, for example, $TlBa_2CaCu_2O_7$, $TlBa_2Ca_2Cu_3O_9$, $Tl_2Ba_2CaCu_2O_8$, $Tl_2Ba_2Ca_2Cu_3O_{10}$, and $TlBa_2(Ca_{1-x}Y_x)Cu_2O_7$ wherein x=0 to 0.6 is accomplished by sputter deposition of Ba, Ca and Cu from oxide targets in the presence of $Tl_2O$ vapor. The amounts of Ba, Ca and Cu in the target depends on the composition sought in the Tl—Ba—Ca—Cu thin films. Accordingly, targets of $Ba_2CaCu_2O_x$ are used in forming $TlBa_2CaCu_2O_7$ and $TlBa_2CaCu_2O_8$ films. Targets of $Ba_2Ca_2Cu_3O_x$ are used in forming $TlBa_2Ca_2Cu_3O_9$ and $Tl_2Ba_2Ca_2Cu_3O_{10}$, and targets of $Ba_2(Ca_{1-x}Y_x)Cu_2O_7$ are used to produce $TlBa_2(Ca_{1-x}Y_x)Cu_2O_7$, wherein x=0 to 0.6 films. Targets of $Pb_2Sr_2(Ca_{1-x}Y_x)Cu_2O_7$ are used to produce $(Tl,Pb)Sr_2(Ca_{1-x}Y_x)Cu_2O_7$, wherein x=0 to 0.6 films. Because PbO is more volatile than the oxides of Sr, Ca, Y and Cu, the target material must have an excess of lead. Lead oxide is, however, much less volatile than thallium oxide and is considered a component of the multicomponent oxide B in the formula $A_yB_z$.

Generally, and in accordance with the invention, a substrate to be coated with the film is mounted onto a substrate block heater. The substrate-heater assembly is placed into a sputtering chamber that contains the desired atmosphere for deposition. The choice of substrate may vary depending on the film that is to be deposited, provided that the substrate and film have a close lattice match. Where oxide materials such as Tl—Ba—Ca—Cu are deposited, suitable substrates include $LaAlO_3$, $NdGaO_3$, $SrTiO_3$, preferably $LaAlO_3$ and $NdGaO_3$.

Together with the substrate heater assembly, separate sources of the involatile and the volatile oxides that provide the film are placed into a sputtering deposition chamber. Typically, the sources of involatile oxides are targets that contain those oxides. The targets are vaporized by conventional methods such as radio frequency sputtering or laser ablation to provide the relatively involatile oxides to the substrate. Such relatively involatile oxides comprise oxides of Sr, Ca and Cu, for example, SrO, CaO and CuO.

The separate source of the volatile oxides, for example, $Tl_2O$, to be deposited onto the substrate can be heated, for example, in the deposition chamber to volatilize those oxides for deposition onto the film.

EXAMPLE 1

A trilayer structure of $(Tl,Pb) Sr_2Ca_{0.5}Y_{0.2}Cu_2O_7$ on $(Tl,Pb)Sr_2Cu_2O_5$ on $(Tl,Pb) Sr_2Ca_{0.8}Y_{0.2}Cu_2O_7$ (1212/1201/1212) was prepared on a [001] oriented $NdGaO_3$ (NGO) substrate in the manner described below.

First a bilayer structure of $(Tl,Pb)Sr_2Cu_2O_5$ on $(Tl,Pb)Sr_2Ca_{0.8}Y_{0.2}Cu_2O_7$ (1201/1212) was prepared by off-axis rf (radio frequency) sputtering in the presence of thallium oxide vapor. A 12 mm×12 mm [001] oriented single crystal $NdGaO_3$ substrate was cleaned by soaking in heated Alconox (a detergent) solution overnight. The substrate was then rinsed with deionized water and blown dry.

The substrate was attached to a resistivity heated nickel heater block with silver paint (Leitsilber 200 from Ted Pella, Inc., 4595 Mountain Lakes Blvd., Redding, Calif. 96003-1448). The substrate heater block was then placed inside the deposition chamber and electrical connections were made to the resistive elements. A thermocouple temperature probe (type K with inconel, a commercial nickel-based alloy, sheath) was inserted into the nickel heater block to provide a temperature signal for a standard feedback type programmable temperature controller (Eurotherm Corp., Sunset Hills Rd., Reston, Va. 22090-5286, model 818P4). The sputtering chamber is equipped with two standard 7.6 cm diameter rf magnetron sputter guns (Kurt J. Lesker Co., 1515 Worthington Ave., Clairton, Pa. 15025, model TRS-5M) which are situated in opposition, about 13 cm apart. One gun held a target of composition $Pb_{1.6}Sr_2CuO_x$ (1201) while the other held a target of composition $Pb_2Sr_2CaCu_{2.1}O_x$ (1212). A mechanical shutter was positioned in front of each gun to avoid deposition on or etching of one target while the other was being used.

The substrate block was located medially between the guns, 3.5 cm above the center of the targets. The source of thallium, located about 6 cm directly below the substrate block, is a resistively heated nickel block. The block has a cavity in the center which is filled with $Tl_2O_3$ powder at the beginning of each deposition. A quartz crystal rate monitor (Leybold Inficon, 6500 Fly Rd., East Syracuse, N.Y. 13057, model IC6000) was used to determine, and control, the $Tl_2O_x$ deposition rate.

The deposition chamber was evacuated to less than $5 \times 10^{-5}$ torr ($7.5 \times 10^{-3}$ Pa) by a standard turbo pump (Baizers, 8 Sagamore Park Rd., Hudson, N.H. 03051, model TPU 330 with a TCP 305 electronic drive) backed by a standard chemical series mechanical pump (Alcatel Vacuum Products, 40 Pond Rd., South Shore Park, Hingham, Mass. 02043, model 2020CP). Standard mass flow controllers were used to set argon and nitrous oxide flow rates into the chamber.

The substrate heater block temperature was raised to 580° C. at a rate of 20° C./m. When the temperature of the substrate block reached 100° C., an Ar flow rate of 15 sccm (standard cubic centimeters per minute) and a $N_2O$ flow rate of 30 sccm was established. The electronic drive unit for the turbo pump was placed in the pressure feedback mode to control the sputtering pressure at 200 mtorr (26.7 Pa).

While the substrate block was being ramped up to temperature, the power to the resistive heating elements of the thallium source was ramped from 0 to 74% in a period of 3 min. by the Leybold Inficon IC6000. The power to the thallium source was kept at 74% for 22 min. after which it was ramped down to 60% power. After a second short dwell at 60% power, the rate monitor was switched to the $Tl_2O_x$ deposition rate feedback mode. The temperature of the thallium source is usually about 450° C. at this point. With the rate monitor located next to the substrate block, the rate was set at 0.22 Å/s (0.022 nm/s).

The shutter over the 1201 target was set in the closed position while that over the 1212 target was set open. Once the substrate block reached 580° C. and the $Tl_2O_x$ rate was steady, the rf power to the gun with the 1212 target was turned up to 100 W. The gun was run at 100 W power for 240 min. and then shut off. At that point, the gas flows were stopped and the pumps turned off. The chamber was filled to a pressure of 500 torr ($5\times10^{+4}$ Pa) with $N_2O$ and the substrate block heated at a rate of 20° C./min. to 800° C. for 60 minutes.

After the 800° C. heat treatment, the sample was cooled at a rate of 5° C./min. down to 595° C. The shutter in front of the 1212 target was closed and the shutter in front of the 1201 target was opened. Meanwhile the thallium source was ramped back up to approximately 400° C. (the $Tl_2O_x$ rate cannot be read while the pressure is high). When the sample was at 595° C. the pumped were turned back on and the chamber evacuated. Before the pressure went too low, the gas flows were set to 25 sccm Ar and 25 sccm $N_2O$ and the electronic driver of the turbo pump was set to give a pressure of 200 mtorr (26.7 Pa). At that point, the $Tl_2O_x$ rate was adjusted to $2\times10^{-11}$ m/s. Then the rf power to the 1201 gun was turned up to 100 W and run for 120 min. At the end of the 1201 deposition, the gas flows were stopped and the pumps turned off. The chamber was filled to a pressure of 500 torr ($6.67\times10^{+4}$ Pa) with $N_2O$ and the substrate block cooled at a rate of 20° C./min. down to room temperature.

After the samples cooled to room temperature, the chamber was vented to air and the substrate heating block removed. The sample was removed from the heating block and the remaining silver paint was scraped off the underside of the substrate with a razor blade. At this point one could pattern the bilayer, if desired. The sample was remounted with two edges covered by pieces of Haynes alloy so as to avoid deposition and therefore allow for later making electrical contact to the lower 1212 layer.

A single 1212 film was then deposited on the bilayer following the procedure described above except that after the 800° C. heat treatment, the sample was cooled at a rate of 5° C./min. down to 400° C. and then at a rate of 20°/min. to room temperature.

The resulting composite structure consisted of a $1\times10^{-7}$ m thick $(Tl,Pb)Sr_2Ca_{0.8}Y_{0.2}Cu_2O_7$ layer on top of a $7\times10^{-8}$ m thick $(Tl,Pb)Sr_2Cu_2O_5$ layer on top of a $1\times10^{-7}$ m thick $(Tl,Pb)Sr_2Ca_{0.8}Y_{0.2}Cu_2O_7$ layer on top of a (001) oriented $NdGaO_3$ substrate and wherein the upper $(Tl,Pb)Sr_2Ca_{0.8}Y_{0.2}Cu_2O_7$ layer only partially covers the lower layers.

X-ray diffraction studies of trilayer films show successful formation of both the 1201 and 1212 materials. All three layers are c-axis oriented, that is, the <001> axes of the 1201 and 1212 materials are normal to the substrate surface. Moreover, there is strong in-plane alignment of the <100> axes of the 1201 and 1212 with the pseudocubic <001> axes of the substrate, $LaAlO_3$. Though the films are not single crystals, they are "epitaxial" in the sense that on a microscopic scale, there is an epitaxial relationship preserved at each interface.

Figure 6:
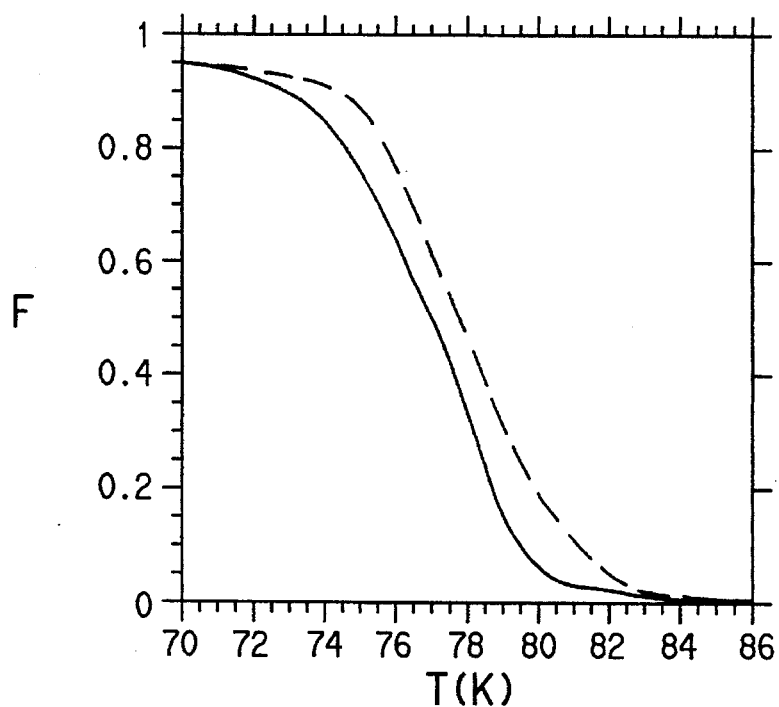
FIG. 6 is a plot of normalized frequency shift versus temperature for multilayered composite articles made in accordance with the Examples herein.

Eddy current measurements shown in FIG. 6, where the normalized frequency shift F is plotted as a function of temperature, demonstrate that the two 1212 layers are superconducting and have slightly different critical temperatures. The two measurements were taken with the sample in two different positions: the solid line is data taken with the films closest to the coil, and therefore the upper 1212 layer closest to the coil while the dashed line is data taken with the film "upside-down" so that the substrate is closest to the coil. In the "upside-down" position, the lower 1212 layer is closer to the coil.

EXAMPLE 2

A trilayer structure of $(Tl,Pb)Sr_2Ca_{0.8}Y_{0.2}Cu_2O_7$ on $(Tl,Pb)Sr_2Cu_2O_5$ on $(Tl,Pb)Sr_2Ca_{0.8}Y_{0.2}Cu_2O_7$ (1212/1201/1212) was prepared on a [100] oriented $LaAlO_3$ substrate as follows.

First a single 1212 film was deposited following the procedure of Example 1 through the end of the first deposition. At that point, the gas flows were stopped and the pumps turned off. The chamber was filled to a pressure of 500 torr with $O_2$ and the substrate block heated at a rate of 20° C./min. to 800° C. for 60 minutes. The samples were thereafter cooled at a rate of 5°/min. down to 400° C. and then at 20°/min. to room temperature.

The next morning, the chamber was vented to air and the substrate heating block removed. The sample was removed from the heating block and the remaining silver paint was scraped off the underside of the substrate with a razor blade. At this point one could presumably pattern the single 1212 layer. Instead, we simply remounted the sample with two edges covered by pieces of $LaAlO_3$ single crystal so as to avoid deposition and therefore allow one to later make electrical contact to the lower 1212 layer.

A 1201/1212 bilayer was then deposited on the 1212 film according to the procedure of Example 1 except that the order of the depositions and anneal was changed as follows.

The deposition chamber was evacuated to less than $5\times10^{-5}$ torr ($7.5\times10^{-3}$ Pa). The substrate heater block temperature was raised to 595° C. at a rate of 20° C./m. When the temperature of the substrate block reached 100° C., an Ar flow rate of 25 sccm and a $N_2O$ flow rate of 25 sccm was established. The electronic drive unit for the turbo pump was placed in the pressure feedback mode to control the sputtering pressure at 200 mtorr (26.7 Pa).

While the substrate block was being ramped up to temperature, the power to the resistive heating elements of the thallium source was ramped from 0 to 74% in a period of 3 min. by the Leybold Inficon IC6000. The power to the thallium source was kept at 74% for 22 min. after which it was ramped down to 60% power. After a second short dwell at 60% power, the rate monitor was switched to the $Tl_2O_x$ deposition rate feedback mode. With the rate monitor located next to the substrate block, the rate was set at $2\times10^{-11}$ m/s (0.02 nm/s).

The shutter over the 1212 target was set in the closed position while that over the 1201 target was set open. Once the substrate block reached 595° C. and the $Tl_2O_x$ rate was steady, the rf power to the gun with the 1201 target was turned up to 100 W. The gun was run at 100 W power for 120 min. and then shut off. The shutter in front of the 1201 target was closed and the shutter in front of the 1212 target was opened. The temperature was ramped to 580° C. at a rate of 20°/min. The $Tl_2O_x$ rate was adjusted up to $2.4\times10^{-11}$ m/s. The gas flows were adjusted to 15 sccm Ar and 30 sccm $N_2O$ while the pressure was held constant at 200 mtorr (26.7 Pa). Once these adjustments were made, the rf power to the 1212 gun was turned up to 100 W. This gun was run at 100 W for 240 min.

After deposition, the gas flows were stopped and the pumps turned off. The chamber was filled to a pressure of 500 torr ($6.67\times10^{+4}$ Pa) with $O_2$ and the substrate block heated to 800° C. for 60 min. The samples were thereafter cooled at a rate of 5°/min. down to 400° C. and then at 20°/min. to room temperature.

The resulting composite structure consisted of a $1\times10^{-7}$ m thick $(Tl,Pb)Sr_2Ca_{0.8}Y_{0.2}Cu_2O_7$ layer on top of a $7\times10^{-8}$ m thick $(Tl,Pb)Sr_2Cu_2O_5$ layer on top of a $1\times10^{-7}$ m Å thick $(Tl,Pb)Sr_2Ca_{0.8}Y_{0.2}Cu_2O_7$ layer on top of a (001) oriented $LaAlO_3$ substrate and wherein the upper $(Tl,Pb)Sr_2Ca_{0.8}Y_{0.2}Cu_2O_7$ and $(Tl,Pb)Sr_2Cu_2O_5$ layers only partially cover the lower $(Tl,Pb)Sr_2Ca_{0.8}Y_{0.2}Cu_2O_7$ layer.

Figure 7:
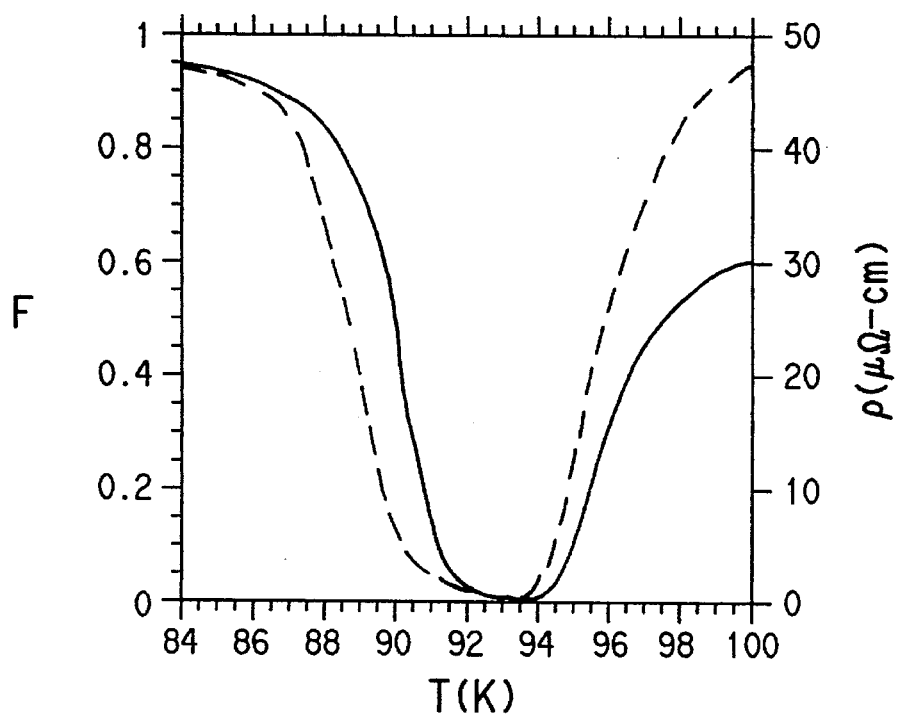
FIG. 7 is a plot of normalized frequency shift and resistivity versus temperature for multilayered composite articles made in accordance with the Examples herein.

Eddy current detection was again used to measure the transition temperatures of the two 1212 layers. As shown in FIG. 7, where the normalized frequency shift F is plotted as a function of temperature, the upper layer has a transition temperature of 92° K. (heavy solid line) while the lower 1212 layer has a $T_c$ of 90° K. (heavy dashed line).

In addition, measurements were made of the resistivity of the upper and lower layers. Eight gold pads were deposited on the sample: four on the upper 1212 layer at the corners of area it extended and four on the lower 1212 layer at the corners of its extent (which had been covered during the second deposition and therefore the lower 1212 layer is exposed). The resistivity ($\rho$), measured by the van der Pauw technique, of the upper (lighter solid line) and lower (lighter dashed line) 1212 layers as a function of temperature are also shown in FIG. 7. The resistivity measurement is more sensitive to the onset of superconductivity and therefore the superconductive transition is seen at slightly higher temperatures. Still, the two 1212 layers do have different transition temperatures proving that the two layers are each, independently superconducting.

Other embodiments of the invention will be apparent to those skilled in the art from consideration of the specification, or from practice of the invention disclosed herein. It is intended that the specification and examples be considered as exemplary only, with the scope and spirit of the invention being indicated by the following claims.

What is claimed is:

1. A vapor phase process for preparing an improved multilayer composite article comprising, in order: 1) a substrate, 2) a first superconducting layer, 3) at least one intermediate layer, each said at least one intermediate layer independently being selected from the group consisting of an insulating layer and a normal conductive layer, and 4) a second superconducting layer, wherein all of said layers at least partially overlap, wherein said first superconducting layer, said intermediate layer, and said second superconducting layer each independently comprise a thallium-containing oxide, said vapor phase process being by vapor phase deposition of successive layers by
providing a first source of relatively volatile thallium-containing oxides,
providing a second source of involatile oxides,
depositing said involatile oxides from said second source onto a substrate while concurrently depositing a sufficient amount of thallium-containing oxides from said first source onto said substrate to provide a crystalline thin film of predetermined stoichiometry, wherein, the improvement in the process comprises heating each of the deposited superconducting films to a temperature greater than 700° C. but less than the decomposition temperature of the film in the presence of $O_2$ or $N_2O$ at a pressure of from about $1.33\times10^{+4}$ Pa to about $10.1\times10^{+5}$ Pa in the presence of a thallium vapor pressure sufficient to avoid evaporation of thallium from said superconducting films.

2. The process of claim 1 wherein the superconducting film is heated to a temperature of from about 700° C. to about 850° C.

3. The process of claim 1 wherein the superconducting film is heated to a temperature of from about 775° C. to about 800° C.

4. The process of claim 1 wherein the pressure of $O_2$ or $N_2O$ is about $6.67\times10^4$ Pa.

5. The process of claim 1 wherein the pressure of $O_2$ or $N_2O$ is from about $2.67\times10^4$ Pa to about $10.1\times10^{+5}$ Pa.

* * * * *